United States Patent [19]

Caywood

[11] Patent Number: 5,070,480
[45] Date of Patent: Dec. 3, 1991

[54] NONVOLATILE ASSOCIATIVE MEMORY SYSTEM

[76] Inventor: John M. Caywood, 1410 Wright Ave., Sunnyvalle, Calif. 94087

[21] Appl. No.: 462,160

[22] Filed: Jan. 8, 1990

[51] Int. Cl.$^5$ .................. G11C 7/00; G11C 15/00; G11C 16/00
[52] U.S. Cl. ................................. 365/49; 365/185; 365/63; 365/168
[58] Field of Search .............. 365/168, 49, 185, 104, 365/230.01, 51, 63, 189.01

[56] References Cited

U.S. PATENT DOCUMENTS

| | | | |
|---|---|---|---|
| 3,490,007 | 1/1970 | Igarashi | 365/49 |
| 3,693,174 | 9/1972 | MacKnight | 340/173 |
| 3,750,115 | 7/1973 | Mundy | 340/173 |
| 3,800,297 | 3/1974 | Mundy et al. | 340/173 |
| 4,064,494 | 12/1977 | Dickson et al. | 365/49 |
| 4,387,447 | 6/1983 | Klaas et al. | 365/185 X |
| 4,652,897 | 3/1987 | Okuyama et al. | 365/168 X |
| 4,725,983 | 2/1988 | Terada | 365/104 X |
| 4,745,579 | 5/1988 | Mead et al. | 307/465 X |
| 4,845,669 | 7/1989 | Chappell et al. | 365/63 X |
| 4,907,194 | 3/1990 | Yamada et al. | 365/49 |
| 4,937,790 | 6/1990 | Sasaki et al. | 365/230.01 |
| 4,942,556 | 7/1990 | Sasaki et al. | 365/49 |
| 4,965,767 | 10/1990 | Kinoshita et al. | 365/49 |

Primary Examiner—Alyssa H. Bowler
Attorney, Agent, or Firm—Townsend and Townsend

[57] ABSTRACT

An associative memory system and system comprising an M by N array of memory cells forming M words of N trit length are disclosed having single word alterability. Each memory cell further comprises first and second nonvolatile storage devices without the need for additional switching devices. Generally, complementary data is stored in the two storage devices and the cell is interrogated by applying complementary data to the storage devices. A match or mismatch is achieved by looking for current through either of the storage devices. Preferably, the storage devices are one of two types of flash EEPROM transistors, or a SONOS transistor. Each transistor has a gate, drain and source and has write and rewrite capabilities that allows single word alterability in the memory array to be accomplished by applying a high voltage to the transistor drain, or by applying a combination of voltages to the drain and gate.

23 Claims, 2 Drawing Sheets

NONVOLATILE ASSOCIATIVE MEMORY SYSTEM

BACKGROUND OF THE INVENTION

This invention relates to electronic memories, and, in particular, to a nonvolatile associative memory cell suitable for read and write operation.

Associative memories or associative content addressable memories (ACAM or CAM) are useful in many applications where a number of records must be searched to see if there is a match to another word. The utility of the ACAM is that the records are searched in parallel and consequently the search can be accomplished in a much shorter time than in a serial search through a conventionally organized memory. Despite the apparent advantage of ACAMs for search applications, they have not been widely utilized because of their high cost relative to conventional memories.

In many applications it is desirable to alter one word in the memory without disturbing the other words. Previous implementations of nonvolatile ACAMs using simple two transistor cells have depended on various write mechanisms. One type of write mechanism alters all cells on an integrated circuit by removing electrons from the storage gate by either exposure to ultraviolet light or application of voltage to the substrate. Another type of write mechanism changes the stored information on an entire column by causing a charge (electron) to tunnel to the storage regions of the transistors in that column by applying a high voltage on the gate line.

Selected methods utilizing associative memory cells are illustrated in the following references. In U.S. Pat. No. 3,693,174, issued to MacKnight, one associative memory array system is comprised of selected memory cells. These memory cells are further comprised of at least two storage transistors and at least five semiconductor switches, preferably transistors. Both storage transistors are nonvolatile type transistors which allow the information stored in them to be read without deteriorating the signal stored therein. FIG. 1 depicts the MacKnight system.

In U.S. Pat. No. 3,750,115, issued to Mundy, a basic memory cell for use in an associative array which consists of three transistors and two voltage variable capacitors is described. To use this cell in a parallel associative search, the flag line of all the cells to be searched in parallel must be common. This means that the flag line must run parallel to the data lines.

In U.S. Pat. No. 3,800,297 issued to Mundy et al., a basic memory cell is used in an associative memory array that is composed of four transistors: two storage transistors and two switching transistors. By applying a large negative pulse to a word line, writing is possible in all the cells connected to the word line.

In U.S. Pat. No. 4,064,494, issued to Dickson et al. a memory cell that allows writing is disclosed but the method to write requires the erasure of all contents in the content addressable memory. Also, unselected, previously stored words are protected in their selected locations while new words are written into their respective cells.

To understand the operation of ACAMs and their application FIG. 1 shows an ACAM 10. In this memory the contents of an "n" position register 12 are simultaneously compared with "m" words contained in array 14. If a match or matches are found, a flag is present on the appropriate $y_j$ output or outputs. For maximum utility, it is desirable to have each location in the input register and the memory capable of three states, "1", "0", and "don't care". Locations capable of storing these three states have been referred to as "trits". It is the purpose of this invention to describe means of storing trits at location 16 in a CAM that will minimize the area occupied by the trit and allow any single arbitrary word in the array to be electrically altered in order to enhance the utility of the memory in a system.

SUMMARY OF THE INVENTION

According to the invention, an associative memory system and method comprising an M by N array of memory cells forming M words of N bit length are disclosed having single word alterability. Each memory cell further comprises first and second nonvolatile storage devices without the need for additional switching devices. Generally, complementary data is stored in the two storage devices and the cell is interrogated by applying complementary data to the storage devices. A match or mismatch is achieved by looking for current through either of the storage devices. Preferably, the storage devices are one of two types of flash EEPROM transistors, or a SONOS transistor. Each transistor has a gate, drain and source and has write and rewrite capabilities that allows single word alterability in the memory array to be accomplished by applying a high voltage to the transistor drain, or by applying a combination of voltages to the drain and gate.

Such a method allows the memory cell area to be greatly reduced as extra switching transistors are eliminated. Another advantage from the elimination of switching transistors is that the interconnect previously necessary to tie together the storage transistors and the switching transistors is also eliminated. Moreover, using storage transistors such as flash EEPROM and SONOS transistors allows single arbitrary words in the memory array to be electrically altered, thus greatly enhancing the utility of the memory in a system. This new method of single word alterability avoids using the time consuming write mechanisms previously used such as exposing the memory device to ultraviolet light, applying a high voltage to the substrate, or by causing an electron to tunnel to the storage regions to erase which erased the entire array and, hence, necessitated rewriting the entire array.

These and other advantages of the invention will become apparent to one of skill in the art as understood in the following detailed description taken in connection with the accompanying drawings.

DETAILED DESCRIPTION OF THE PREFERRED EMBODIMENTS

Figure 1:
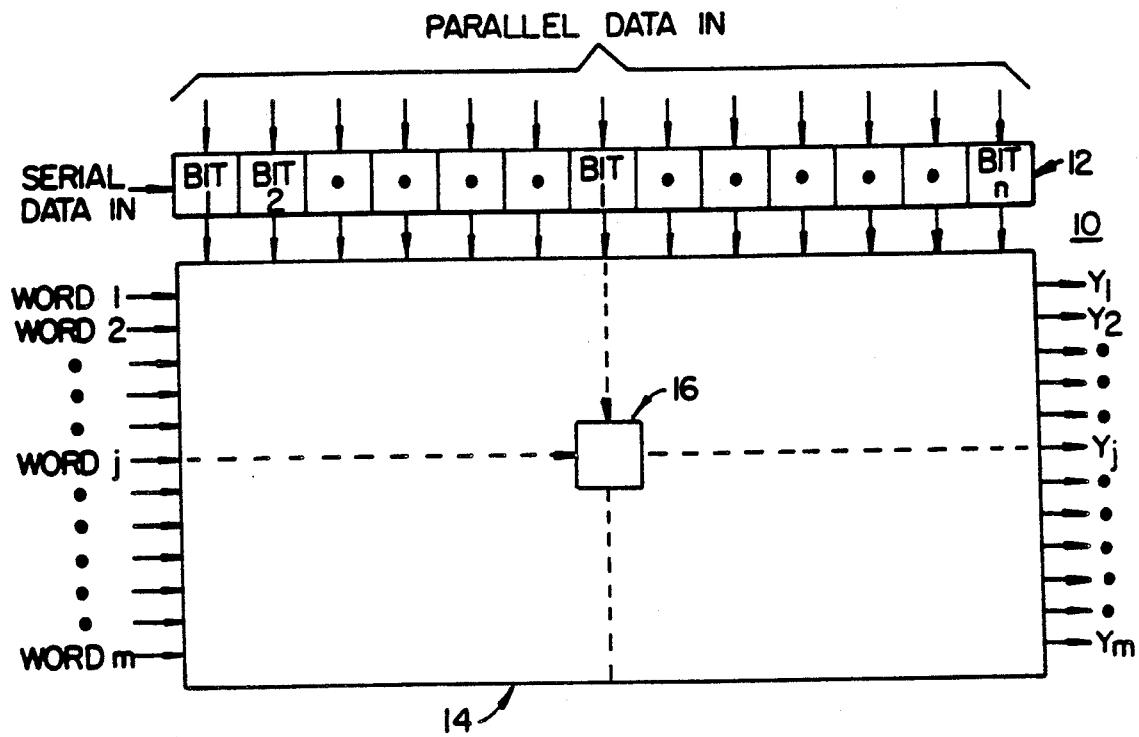
FIG. 1 show a basic associative memory system.
Figure 2:
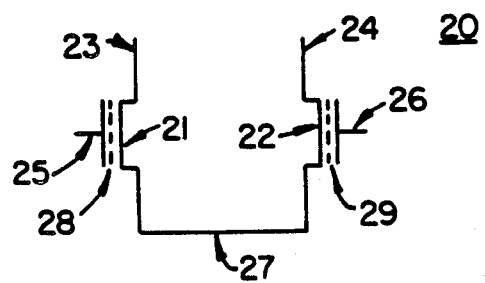
FIG. 2 shows a schematic diagram of a memory cell according to the present invention.

FIG. 2 shows schematically a memory cell 20. Memory cell 20 is comprised of two transistors 21 and 22, both capable of nonvolatile information storage. The dashed lines in gates 25 and 26 of transistors 21 and 22, respectively, indicate that charge may be stored in gate regions 28 and 29 to set the state of each transistor 23 and 24. This stored charge affects the conduction threshold (voltage) of each transistor 21 and 22 so that the charge state may be detected by sensing the conduction of the transistor. Preferably, only two states per transistor (e.g. on and off) are allowed; this choice greatly simplifies conduction sensing and contributes to a design highly tolerant to variation in circuit parameters. Furthermore, only a minimum of two transistors are needed to store a trit.

In one specific embodiment, a well known "floating gate" transistor is used. In such a device, a polycrystalline silicon layer is sandwiched between a substrate and a control gate. This sandwiched layer is completely surrounded by a dielectric which insulates the gate such that when it is charged, the charge remains under normal operation and storage conditions. For example, in the case of an n-channel transistor, putting a negative charge on the floating gate raises the threshold conduction voltage, while removing the charge lowers the threshold conduction voltage. In normal operation, one state is set by putting enough electrons onto the floating gate such that it will not conduct when a read mode voltage (e.g. 5 volts (V)) is put on the control gate. The other state is established by removing enough electrons such that the transistor conducts when the read mode voltage is applied to the control gate. When a deselect voltage, usually ground, is applied to the control gate, the transistor does not conduct in either case.

In cell 20 (FIG. 2), preferably the "1" state is defined as transistor 21 "on" and transistor 22 "off". The "0" state is then defined as transistor 22 "on" and transistor 21 "off". The "don't care" state is when both transistors are "off". A search is performed by applying a first and second voltage to gates 25 and 26, respectively. The two voltages applied to the two gates are normally complements, that is the read voltage (5 V) is applied to one gate and the deselect voltage (normally 0 V) is applied to the other. Thus, if cell 20 is in the "1" state and 5 V is applied to gate 25 of transistor 21 while gate 26 of transistor 22 is grounded, current flows through transistor 21. This is detected as a "mismatch". If the gate voltages are reversed, no current flows through either transistor 21 or 22 because transistor 21 is deselected and transistor 22 is in the "off" state. This is detected as a "match" on this trit.

Figure 3:
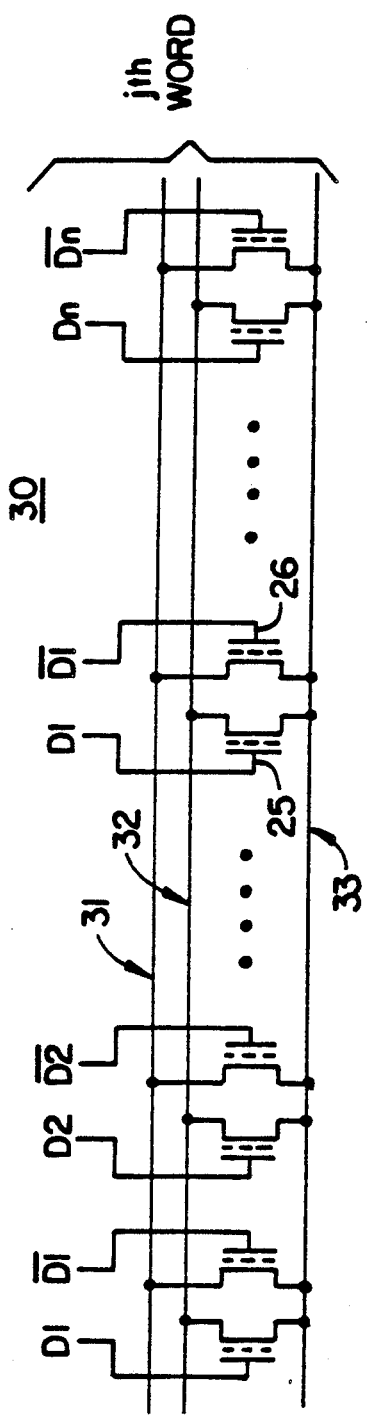
FIG. 3 illustrates a schematic diagram of the memory cell of FIG. 2 incorporated into a word row.

A word of memory is shown schematically in FIG. 3. In this word, the drains of "n" cells are connected in parallel to a first sense line 31 and a second sense line 32 and all the sources are tied to a common line 33. The gates of each cell are connected to the corresponding cell of the input register. Each cell of the input register normally generates two complementary outputs $D_i$ and $\overline{D}_i$. If all cells match, no current flows between either of sense lines 31 or 32 and the common source line 33. In this case the word matches the input. Any column of trits can be masked by holding both of the output lines from the corresponding cell of the input register low. Similarly, if one of the trits in the $j^{th}$ word is in the "don't care" state, the determination of the match between the input register and that word is made based on the other trits in the word, since that cell never conducts.

Examination of FIG. 3 shows that the restriction of changing only one word constrains the memory to use a write mechanism which causes a change in the state of the memory transistors depending solely on the voltage applied on lines 31 or 32 to the transistor drains, or depending on a combination of the voltages applied on $D_i$ or $\overline{D}_i$ on the gate and on lines 31 or 32 on the drain.

In a preferred application, the write mechanism includes an erase mode and a program mode. The erase mode occurs by applying a high voltage to both drains 23 and 24 with gates 25 and 26 held at ground. The program mode occurs by applying a voltage to either gate 25 or 26, or both and a high voltage to their respective drain 23 or 24. In the erase mode, the common source line 33 is allowed to float. In the program mode, the common source line is held at ground.

Figure 5:
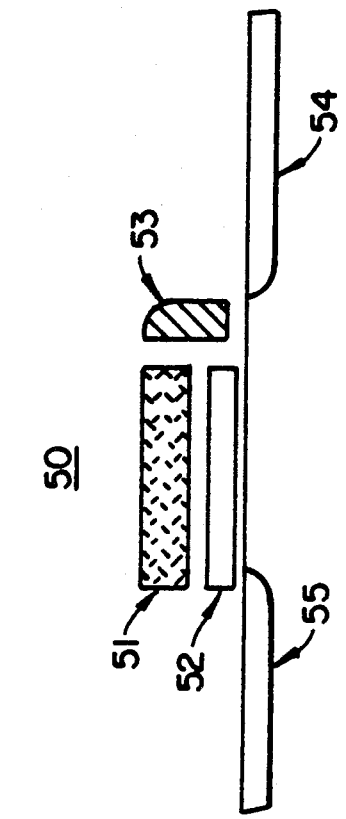
FIG. 5 shows a cross-sectional view of an alternate storage transistor type which could be used in the present invention.

A recently introduced memory technology called flash electrically erasable programmable read only memory (EEPROM) provides the desired write mechanism functionality. This technology uses injection of channel hot electrons onto the floating gate to charge the storage gate negative and removal of electrons from the floating gate by application of a high voltage on the drain to charge the storage gate positive. Two specific cases are shown by way of illustration in FIGS. 4 and 5.

Figure 4:
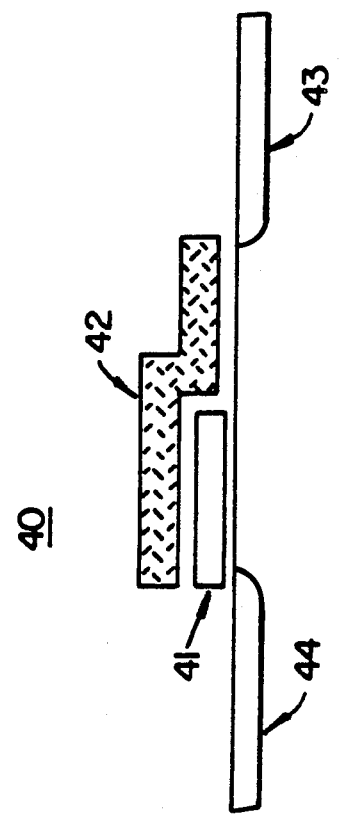
FIG. 4 shows a cross-section view of a storage transistor type used in the present invention.

In FIG. 4, a storage transistor 40 is formed from a merged gate transistor with a source 43 and a drain 44. This transistor 40 is viewed as two transistors in series, one consisting of a stacked gate transistor formed by an overlap of a control gate 42 on a floating storage gate 41, and the other formed by an overlap of control gate 42 on a substrate, and connected by a virtual source-drain. Preferably, transistor 40 is designed such that when control gate 42 is taken to 5 V, a conducting path is formed between source 43 and drain 44 when floating gate 41 is charged positive. Otherwise, no conducting path is formed if floating gate 41 is charged negatively. Floating gate 41 may be charged positively by taking drain 44 to a high voltage, typically between 12 V and 20 V, while control gate 42 is held at ground. Conversely, floating gate 41 is charged negatively by taking control gate 42 to a high voltage, typically about 12 V, while drain 44 is taken to an intermediate high voltage, typically about 8 V. Current flows between source 43 and drain 44 and generates hot electrons in the channel region of the transistor near drain 44. Some of these electrons are attracted to the floating gate 41 which has been capacitively coupled to a positive voltage by the voltage applied to control gate 42. Because the hot electrons are generated by the channel current, programming occurs only at the intersection of large positive drain and control gate voltages.

In another specific embodiment, storage transistor 50 (FIG. 5) is also composed of two transistors merged by a virtual source-drain. In this case a source 54 and a drain 55 are separated by a stacked gate transistor formed by an overlapping of a control gate 51 on a floating storage gate 52, and a "sidewall" gate 53 formed adjacent to the stacked gate transistor with no intervening diffusion. Sidewall gate 53 may be a floating gate; in which case, its potential is set capacitively by the potential of adjacent potentials (preferably that of control gate 51), or a contact may be made to it. In either case of operation, the sidewall gate 53 potential is generally the same. When control gate 51 goes to 5 V to read, the sidewall gate 53 transistor is in a conducting state and the integrated transistor has a conducting path between drain 55 and source 54 if storage gate 52 is charged positive. If storage gate 52 is charged negatively, there is no conducting path between source 54 and drain 55. If control gate 51 is at ground, sidewall gate 53 is also at a low potential and no conduction can occur between source 54 and drain 55. The storage gate 52 is charged positively by applying a high voltage, typically between 12 V and 20 V, to drain 55 while control gate 51 is at ground. This causes electrons to tunnel from storage gate 52 to the drain 55 leaving gate 52 positively charged. Storage gate 52 is charged negatively by applying a positive voltage, typically 5 V, to drain 55 while control gate 51 is taken to a high voltage, typically in the range of 10 V to 15 V. Sidewall gate 53 goes to an intermediate voltage. There is a high field region occurring under the dielectric spacer which separates sidewall gate 53 from the stacked gates 51 and 52; this field generates a large density of hot electrons under the source end of floating gate 52. The positive potential arising on storage gate 52 because of capacitive coupling from the control gate attracts some of these hot electrons to storage gate 52.

These two described embodiments of the storage transistor are given by way of examples and are not intended to be an exhaustive listing. For example, an silicon oxide nitride oxide semiconductor (SONOS) transistor which is programmed by channel hot electrons and erased by a high drain voltage would also serve. What is essential to this invention is two nonvolatile storage transistors connected in an OR configuration, as illustrated in FIG. 2, to form a cell as connected in FIG. 3. Generally, complimentary data is stored in the two storage transistors and the cell is interrogated by applying complementary data to the two transistor control gates and looking for current through either transistor. A single word can be altered in the memory array by applying a high voltage to the transistor drains or by applying a combination of voltages to the drain and gate.

The invention has now been explained with reference to specific embodiments. Other embodiments will be apparent to those of ordinary skill in the art. It is therefore not intended that the invention be limited except as indicated by the appended claims.

What is claimed is:

1. A row of memory cells comprising:
    a first row line;
    a second row line;
    a third row line;
    a set of true bit lines
    a set of complementary bit lines;
    a first set of electrically erasable programmable memory transistors having gates connected to corresponding ones of the true bit lines and sources and drains connected between the first and second row lines; and
    a second set of electrically erasable programmable memory transistors having gates connected to corresponding ones of the complementary bit lines and sources and drains connected between the first and third row lines.

2. The row of memory cells as in claim 1 further including means for erasing the contents of each memory cell in the row, the erasing means including means for applying first and second potentials to the second and third rows lines, respectively.

3. The row of memory cells as in claim 1 further including means for selectively programming the first set of memory transistors, the programming means including means for applying first and second potentials to the second row line and the true bit lines, respectively.

4. The row of memory cells as in claim 3 further including means for selectively programming the second set of memory transistors, the programming means including means for applying the first and second potentials to the third row line and the complementary bit lines, respectively.

5. The row of memory cells of claim 1 wherein the transistors comprise electrically erasable programmable transistors.

6. The row of memory cells of claim 1 wherein the transistors comprise silicon oxide nitride oxide semiconductor transistors.

7. An associative memory system for comparing an applied signal having N digits, each having three possible states, one such digit being termed a trit, to M stored words of N trits each, and in response providing output signals indicative of the correlation of the applied signal with the stored words, the memory comprising:
    an M row by N column array of memory cells in which each row of N memory cells represents one word of N trit length and each column of M memory cells represents the same trit in each of the M words;
    each of the memory cells including first and second semiconductor memory devices each capable of being placed in one of two states, and each memory device having a control electrode, an output electrode and a common electrode;
    means interconnecting the control electrodes of the first semiconductor memory devices in memory cells which are in the same column;
    means interconnecting the control electrodes of the second semiconductor memory devices in memory cells which are in the same column;
    means interconnecting the common electrodes of the semiconductor memory devices the memory cells which are in the same row;
    means interconnecting the output electrodes of the first semiconductor memory devices of the memory cells which are in the same row;
    means interconnecting the output electrodes of the second semiconductor memory devices of the memory devices which are in the same row;
    input means for applying a signal to be compared to the control electrodes of the first and second semiconductor memory device of each memory cell indicative of the state of a corresponding portion of the applied signal to be compared with the stored word;
    means for applying an interrogation signal to the common electrodes of the semiconductor memory devices in each row of the memory cells; and
    means for obtaining an output signal from the output electrodes of the memory devices in each row of the memory cells indicative of a correlation of the ternary word stored in that row and the applied signal at the time of application of the interrogation signal.

8. An associative memory system as in claim 7 further comprising means for setting a threshold voltage of each of the first and second semiconductor memory devices in each memory device to indicate the state of a binary bit to be stored in that particular memory device, the combination of memory cells in a row thereby storing a word formed of a series of ternary trits.

9. The memory system of claim 8 wherein the means for setting a threshold voltage further includes means for applying a first signal to the means interconnecting the control electrodes of all columns and a second signal to the means interconnecting the first output electrodes of the row for setting the contents of the first semiconductor memory devices in the memory cells of the row.

10. The memory system of claim 9 wherein the means for setting a threshold voltage further includes means for applying a first signal to the means interconnecting the control electrodes of all columns and a second signal to the means interconnecting the second output electrodes of the row for setting the contents of the second semiconductor memory devices in the memory cells of the row.

11. An associative memory system as in claim 7 further comprising means for applying an erase signal to all of the output electrodes of the memory devices in a selected row of memory cells to thereby allow the contents of the selected row to be altered while maintaining the contents of the remaining rows.

12. The memory system of claim 11 further comprising means for applying an erase signal to the input electrodes of both the first memory devices and the second memory devices in each column of memory cells to allow the contents of the selected row to be altered without altering the contents of the remaining rows.

13. The memory system of claim 7 wherein the semiconductor memory devices in the memory cells each comprise an insulated gate field-effect transistor having a floating gate and a control gate.

14. The memory cell of claim 13 wherein the semiconductor memory devices comprise silicon oxide nitride oxide semiconductor (SONOS) transistors.

15. The memory cell of claim 13 wherein the floating gate field-effect transistors comprise flash EEPROM transistors.

16. An associative memory cell for comparing an applied signal to information stored in the cell and for providing an output signal indicative of the comparison, the cell comprising:
    first and second semiconductor memory devices each having setable threshold voltages and each having a control electrode, an output electrode and a common electrode;
    means for setting the threshold voltage of the semiconductor memory devices indicative of the information to be stored in the memory cell;
    means for applying signals to the control electrodes of the semiconductor memory devices indicative of the applied signal to be compared to the stored information;
    means for applying an interrogation signal to the common electrodes of the semiconductor memory devices; and
    means connected to the output electrodes for obtaining an output signal from the output electrodes indicative of the comparison of the stored information trit and the applied signal at the time of application of the interrogation signal.

17. The memory cell of claim 16 wherein the means for setting the threshold voltage further includes means for applying signals to the control electrodes of the semiconductor devices and second signals to the output electrodes to thereby set the contents of the memory devices.

18. The memory cell of claim 17 wherein the floating gate field-effect transistors comprise flash EEPROM transistors.

19. The memory cell of claim 17 wherein the semiconductor memory devices comprise silicon oxide nitride oxide semiconductor (SONOS) transistors.

20. A method of comparing an applied N trit signal to a selected one of M stored ternary words of N trits each in an associative memory system of N columns and M rows, and in response providing output signals indicative of the correspondence of the applied signal with the stored word, the method comprising the steps of:
    coupling the applied n trit signal to the input electrodes of first and second semiconductor memory devices of each column in the memory system;
    applying an interrogation signal to a common electrode of the semiconductor memory devices in a row of the memory system; and
    obtaining an output signal from an output electrode in that row of the memory system; and
    repeating the steps of applying the interrogation signal and obtaining an output signal.

21. A method of storing, retrieving, and rewriting information in an associative memory system comprising the steps of:
    providing an M by N array of memory cells each having no more than two transistors and in which each row of N memory cells represents one word of N trit length an each column of M memory cells represents a corresponding trit in each of the M words;
    storing information in the array in a predetermined pattern to selectively enable portions of the array;
    applying input information to the array;
    sequentially performing read and then search operations to operate on the input information in accordance with the pattern of stored information; and
    applying a changing signal to a single N-trit word in the array to alter the contents of that word but not the contents of the remaining words.

22. The method according to claim 21 wherein the step of applying a changing signal further comprises the steps of:
    applying a first signal to input lines of the memory cells in the same row containing the word; and
    applying a second signal to output lines of first semiconductor devices in the same row containing the word.

23. The method according to claim 22 wherein the step of applying a changing signal further comprises the steps of:
    applying the first signal to the input lines of the semiconductor devices in the same row containing the word; and
    applying the second signal to the output lines of the second semiconductor devices in the same row containing the word.

* * * * *